(12) United States Patent
Braceras et al.

(10) Patent No.: US 9,236,116 B1
(45) Date of Patent: Jan. 12, 2016

(54) MEMORY CELLS WITH READ ACCESS SCHEMES

(71) Applicant: INTERNATIONAL BUSINESS MACHINES CORPORATION, Armonk, NY (US)

(72) Inventors: George M. Braceras, Essex Junction, VT (US); Venkatraghavan Bringivijayaraghavan, Cheyyar (IN); Binu Jose, Biaora via (IN); Krishnan S. Rengarajan, Bangalore (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/669,043

(22) Filed: Mar. 26, 2015

(51) Int. Cl.
    *G11C 11/00*     (2006.01)
    *G11C 11/419*    (2006.01)

(52) U.S. Cl.
    CPC .................... *G11C 11/419* (2013.01)

(58) Field of Classification Search
    USPC ............. 365/154, 204, 189.15, 189.11
    See application file for complete search history.

(56) References Cited

U.S. PATENT DOCUMENTS

| | | | |
|---|---|---|---|
| 6,839,299 B1 * | 1/2005 | Bhavnagarwala ... | G11C 7/1045 365/185.16 |
| 7,196,947 B2 | 3/2007 | Seitz | |
| 7,474,583 B2 | 1/2009 | Yamamura | |
| 7,679,948 B2 | 3/2010 | Park et al. | |
| 7,733,686 B2 | 6/2010 | Clinton | |
| 7,760,558 B2 | 7/2010 | Ch'ng et al. | |
| 8,331,180 B2 | 12/2012 | Adams et al. | |
| 2005/0213370 A1 * | 9/2005 | Khellah ............... | G11C 11/419 365/154 |
| 2014/0112064 A1 | 4/2014 | Adams et al. | |

OTHER PUBLICATIONS

Chang et al., "A 20nm 112Mb SRAM in High-κ metal-gate with assist circuitry for low-leakage and low-VMIN applications", International Solid-State Circuits Conference Digest of Technical Papers (ISSCC), 2013 IEEE, 2013, pp. 316-318.

Liu et al., "Low-power high-yield SRAM design with VSS adaptive boosting and BL capacitance variation sensing", IEEE 10th International Conference on ASIC (ASICON), 2013, 4 pages.

Wang et al., "A 45nm Dual-Port SRAM with Write and Read Capability Enhancement at Low Voltage", IEEE, 2007, pp. 211-214.

Yabuuchi et al., "A 45nm 0.6V Cross-Point 8T SRAM with Negative Biased Read/Write Assist", Symposium on VLSI Circuits Digest of Technical Papers, 2009, pp. 158-159.

* cited by examiner

*Primary Examiner* — Vu Le
(74) *Attorney, Agent, or Firm* — Anthony Canale; Andrew M. Calderon; Roberts Mlotkowski Safran & Cole, P.C.

(57) ABSTRACT

Memory cells with read assist schemes and methods of use are provided. The memory includes a plurality of rows and columns, each of which include a memory cell having a pull-down device. The memory further includes at least one boost circuit connected to each of the memory cells and which provides a negative boost signal to the pull-down devices during read access.

20 Claims, 3 Drawing Sheets

MEMORY CELLS WITH READ ACCESS SCHEMES

FIELD OF THE INVENTION

The invention relates to semiconductor structures and, more particularly, to memory cells with read assist schemes and methods of use.

BACKGROUND

SRAM is a type of semiconductor memory that uses bistable latching circuitry to store each bit. The term static differentiates it from dynamic RAM (DRAM) which must be periodically refreshed. An SRAM cell has three different states: standby, read and write. The SRAM to operate in read mode and write mode should have "readability" and "write stability" respectively.

When not accessed, the bitlines are precharged to a predetermined state. Precharging to supply voltage can cause cell disturbance (cell stability issue) when the WL is turned ON for access, precharging to a very low value can make it difficult to write to the cell. An optimum value needs to be chosen that works best for stability and Writeability, across process corners. A lower-than-supply voltage precharge value also helps improve the performance. In the read access state, the reading process requires only asserting the wordline WL and reading the SRAM cell state by a single access transistor and bit line. Nevertheless bitlines are relatively long with large parasitic capacitance. Therefore to speed-up reading, more complex processes are used in practice; that is, driving the bit lines to a threshold voltage (midrange voltage between logical 1 and 0).

By asserting the word line WL, both the access transistors are enabled which cause that the bitline voltage to either slightly drop or rise. Then the two bitlines will have a small voltage difference between them while reaching a sense amplifier, which will sense which line has the higher voltage thus determining whether there was "1" stored or "0" stored. The higher the sensitivity of the sense amplifier, the faster the speed of the read operation.

SUMMARY

In an aspect of the invention, a memory comprises a plurality of rows and columns, each of which include a memory cell having a pull-down device. The memory further comprises at least one boost circuit connected to each of the memory cells and which provides a negative boost signal to the pull-down devices during read access.

In an aspect of the invention, a memory comprises a memory cell comprising a crossover inverter comprising a pull-up device and a pull-down device connected to bitlines through access transistors. The memory further comprises a boost circuit connected to the pull-down devices and providing a negative boost signal to the pull-down device during read access.

In an aspect of the invention, a method comprises boosting negatively a bitcell of a memory device during a read access.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to memory cells with read assist schemes and methods of use. More specifically, embodiments of the invention relate to SRAM cells with improved read capabilities, e.g., by a factor of $2\sigma$ to $2.5\sigma$ at a process corner of 0.675 V at $-40°$ C. In embodiments, the SRAM cells comprise a read assist scheme that is based on boosting a bitcell low voltage reference (Vboost1), and a circuit that can switch on and off boost capacitance for such boosting operations. In embodiments, control signals control the boost capacitance during read operations without impacting write operations.

In more specific embodiments, the read assist scheme includes a read assist circuitry (boost circuit) that provides a negative boost to the bitcell low voltage reference (Vboost1) during read access to increase read efficiency operations. By implementing the different aspects of the invention, the boosted negative signal of the boost circuit will increase the strength of the pull-down device of the memory cell and hence set a faster pull-down on the bitline BTL0. The faster pull-down of the bitline will, in turn, increase read performance of the memory cell. In aspects of the invention, the boost circuit can be a charge pump, which provides boosted negative signals to the bitcell low voltage reference (Vboost1) during read access and, in more specific embodiments, provides a boosted negative signal to selected pull-down devices of a memory cell during read access.

Thus, advantageously, the read scheme described herein improves SRAM readability, without affecting write operations or significantly impacting other metrics of the bitcell. The read scheme also improves readability of multi-port memories. Moreover, the improved readability will enable higher density memories and higher frequency operation (compared to conventional memory cells). For example, by using the boost circuit to increase performance read operations, it is now possible to include 512 rows in each column of memory (compared to conventional systems which can only utilize 256 rows in each column of memory).

Figure 1:
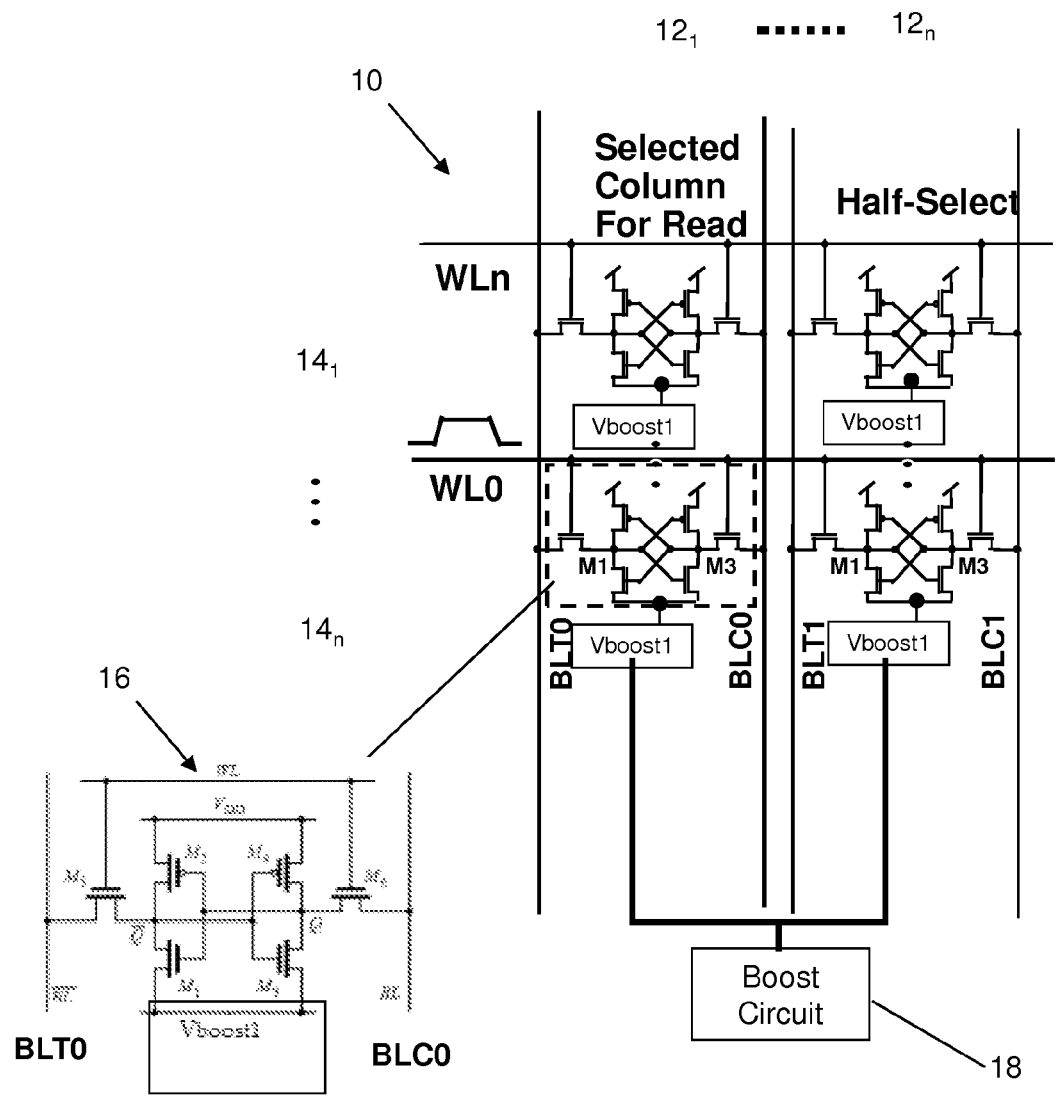
FIG. 1 shows a read assist architecture in accordance with aspects of the invention.

FIG. 1 shows a read assist architecture in accordance with aspects of the invention. The read assist architecture 10 includes memory cells 16 arranged in a plurality of columns $12_1$-$12_n$ and a plurality of rows $14_1$ to $14_n$. In embodiments, the plurality of columns $12_1$-$12_n$ include a selected column (for read operations) and a half select column. The rows $14_1$ to $14_n$ include wordline WLn (a wordline row set at high for non-read operations) and wordline WL0 (a wordline row set at low read operations). By implementing this scheme, a single memory cell 16 at the intersection of the selected column (for read operations) and wordline, WL0, can have read access.

In embodiments, each memory cell 16 is connected to a common boost circuit 18. As will be described further herein, the boost circuit 18 is provided at Vboost1 and provides a negative boost signal during read operations. The negative boost signal will strengthen the pull-down devices of the memory cell, making them become stronger due to a higher Vgs and hence allowing the bitline BTL0 to discharge faster significantly increasing the readability of the memory cell 16.

In an illustrative embodiment, each memory cell 16 can be a static random-access memory cell (SRAM). More specifically, as shown in the exploded view of the memory cell 16 of FIG. 1, the memory cell 16 includes six transistors (FETs), where each bit and its compliment is stored on four transistors ($M_1$, $M_2$, $M_3$, $M_4$) that form two cross-coupled inverters. In embodiments, the transistors (PFETs) $M_2$, $M_4$ are pull-up devices; whereas, the transistors (NFETs) $M_1$, $M_3$ are pull-down devices. In embodiments, Q and Q' are complementary data that is stored in the memory cell. Thus, this memory cell 16 has two stable states which are used to denote 0 and 1.

As further shown in FIG. 1, the memory cell 16 includes two access transistors (NFETs) $M_5$ and $M_6$ that serve to control the access to a single storage cell during read and write operations. These transistors are also known as passthough gates. In embodiments, access to the memory cells 16 are enabled by the word line (WL) which controls the two access transistors (NFETs) $M_5$ and $M_6$ which, in turn, control whether the memory cell 16 should be connected to the bitlines: BTL0 and BLC0. In embodiments, the bitlines BTL0 and BLC0 are used to transfer data for both read and write operations. The bitlines BTL0 and BLC0 can be pre-charged at a high potential, with the bitline BTL0 being turned off prior to read access operations.

The low voltage reference Vboost1 and more specifically the sources of the pull-down devices (NFETs) $M_1$ and $M_3$ are commonly connected to the boost circuit 18. During read access operations, the wordline (WL0) is turned on, pre-charging of the bitline BTL0/BCL0 is turned off, and the NFET devices (NFETs) $M_1$ and $M_5$ pull the bitline BTL0 low. The boost circuit 18 will also actively boost negative Vboost1 using, e.g., a signal of about −75 mV as one illustrative example.

In more specific embodiments, the boost circuit 18 will strengthen the pull-down device (NFET) $M_1$, allowing faster pull-down of the bitline BTL0 and hence increasing read access. Illustratively, during read access all of the pull-down devices $M_1$, $M_3$ are boosted negative at the same time, as they are all commonly connected to the boost circuit 18. By boosting the sources of the pull-down devices $M_1$ and $M_3$ negative, the pull-down devices $M_1$, $M_3$ become stronger due to a higher Vgs. This, in turn, allows the bitline BTL0 to discharge faster which will significantly increase the readability of the memory cell 16. In embodiments, the boost can be implemented in the WL direction, area permitting; however, there is no boost provided during write access.

Figure 2:
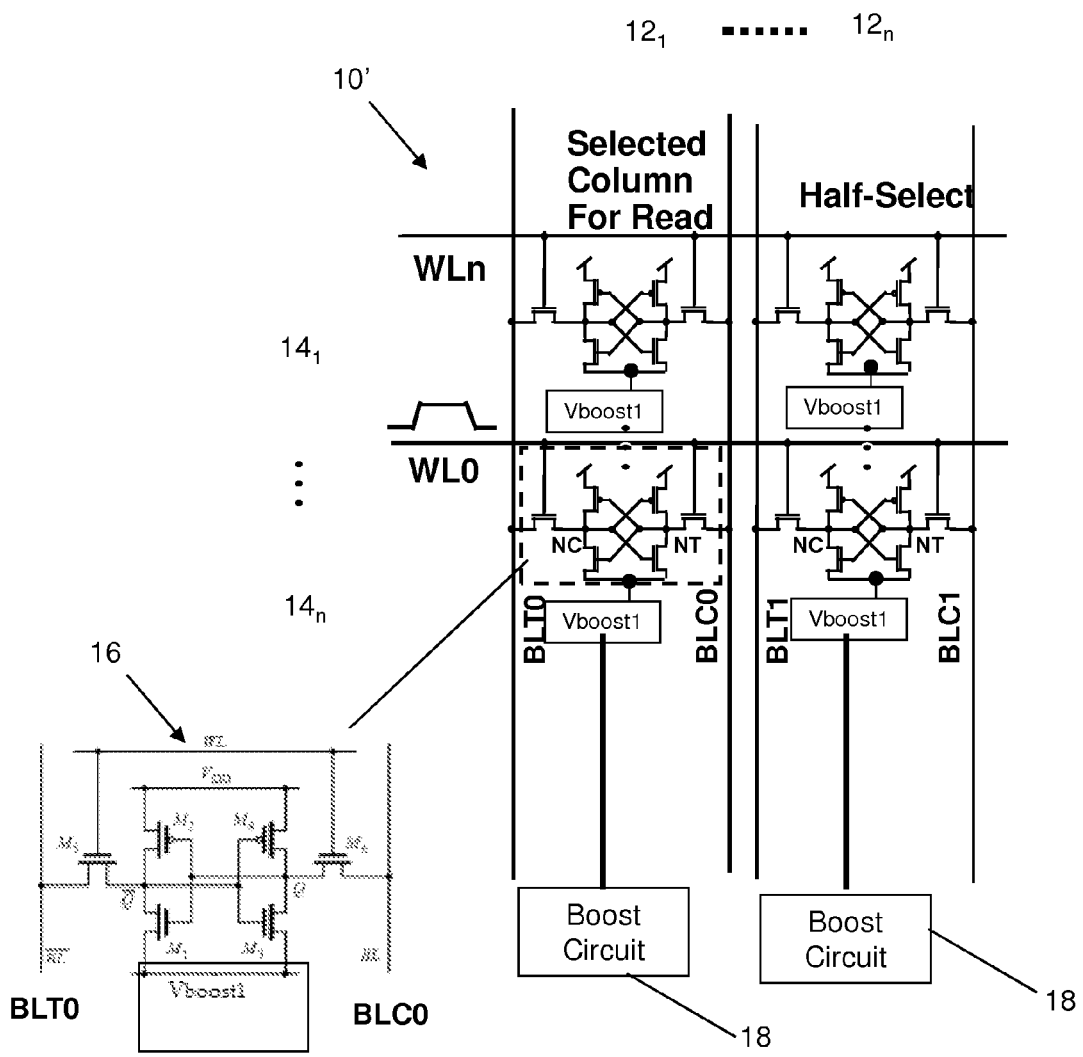
FIG. 2 shows a read assist architecture in accordance with additional aspects of the invention.

FIG. 2 shows a read assist architecture in accordance with an alternative aspect of the invention. The read assist architecture 10' of FIG. 2 includes memory cells arranged in a plurality of columns $12_1$-$12_n$ and a plurality of rows $14_1$ to $14_n$. As in the architecture of FIG. 1, the plurality of columns $12_1$-$12_n$ each includes a selected column (for read operations) and a half select column. The rows $14_1$ to $14_n$ include WLn and WL0. In embodiments, each row and column includes a memory cell 16, where all of the memory cells in each column are connected to a common boost circuit 18.

In embodiments, as in the structure shown in FIG. 1, each memory cell 16 can be a SRAM cell which includes six transistors (FETs) where each bit is stored on four transistors ($M_1$, $M_2$, $M_3$, $M_4$) that form two cross-coupled inverters. As previously discussed, the transistors (PFETs) $M_2$, $M_4$ are pull-up devices; whereas, the transistors (NFETs) $M_1$, $M_3$ are pull-down devices. The memory cell 16 also includes two access transistors (NFETs) $M_5$ and $M_6$ that serve to control the access to a single storage cell during read and write operations. In embodiments, access to the memory cells 16 are enabled by the word line (WL) which controls the two access transistors (NFETs) $M_5$ and $M_6$ which, in turn, control whether the memory cell 16 should be connected to the bitlines: BTL0 and BLC0.

In embodiments, the bitlines BTL0 and BLC0 transfer data for both read and write operations. The bitlines BTL0 and BLC0 can be pre-charged at a high potential, with the bitline precharge being turned off prior to read access operations. The low voltage reference Vboost1 and more specifically the sources of the pull-down devices (NFETs) $M_1$, $M_3$ in each column $12_1$ to $12_n$ are commonly connected to a boost circuit 18. Since a boost circuit 18 is only activated for each column separately, this aspect of the invention can have significant power savings.

As described with regard to the architecture of FIG. 1, during read access operations, the wordline (WL0) is turned on, pre-charging of the bitline BTL0 is turned off, and the pull-down devices (NFETs) $M_1$, $M_5$ pull the bitline BTL0 low. In the architecture 10' of FIG. 2, the boost circuit 18 will also actively boost the source of the memory pull down devices $M_1$, $M_3$ for a particular column (i.e., selected column for read operations). That is, the boost circuit 18 will increase read access by strengthening the pull-down devices (NFETs) $M_1$, $M_3$ for each memory cell in the selected read column, allowing faster pull-down of the bitline BTL0. By boosting the sources of the pull-down devices $M_1$, $M_3$ negative, the pull-down devices $M_1$, $M_3$ become stronger due to a higher Vgs which, in turn, allows the bitline BTL0 to discharge faster significantly increasing the readability of the memory cell 16 in the selected column.

Thus, as should now be understood by those of skill in the art, the architecture 10' shown in FIG. 2:

(i) provides boosted negative during reads only for selected columns;
(ii) saves power;
(iii) does not provide boost during write operations;
(iv) improves readability significantly;
(v) provides negative Boost in the bitline direction; and
(vi) provides boost which can be implemented in the WL direction as well, area permitting.

Figure 3:
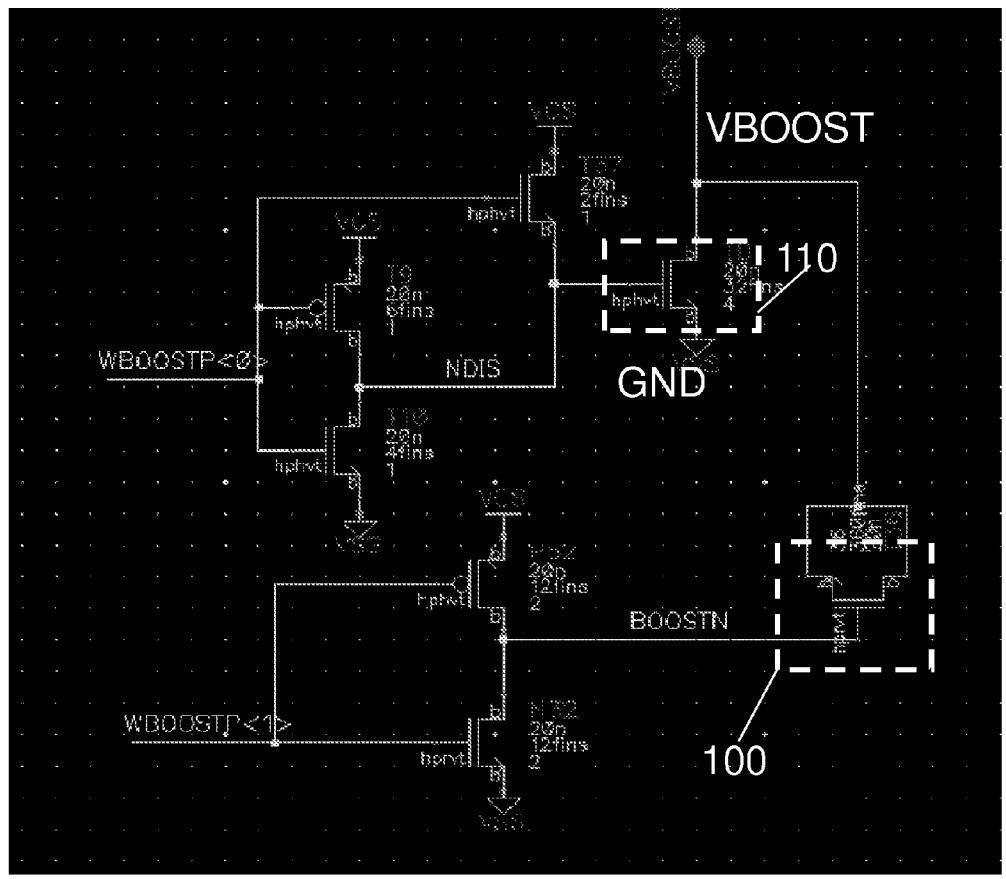
FIG. 3 shows an exemplary, non-limiting boost circuit in accordance with aspects of the invention.

FIG. 3 shows an exemplary, non-limiting boost circuit 18 in accordance with aspects of the invention. In embodiments, the boost circuit 18 can be a charge pump which uses capacitors as energy storage elements to create either lower voltage power source to the sources of the pull-down devices.

As is shown in FIG. 3, the boost circuit 18 includes a VBOOST signal connected to the sources of each of the pull-down devices of the memory cell during read operations and to GND (Vss) during write operations (by turning on FET 110). A top plate of capacitor 100 is connected to the VBOOST signal and a bottom plate of the capacitor 100 is connected to BOOSTN. In operation, when the boost signal control is activated during read access, the FET 110 is turned off, and the bottom plate of the capacitor 100, which is connected to BOOSTN, will take the VBOOST signal negative, thereby providing a boost to the pull-down devices of the memory device. This negative signal will strengthen the pull-down device, bringing the BTL0 down faster and hence increase read performance. In this way, the circuit can switch on the boost capacitance to increase read performance and switch off the boost capacitance during write operations.

The memory cells of the present invention can be manufactured in a number of ways using a number of different tools. In general, though, the methodologies and tools are used to form structures with dimensions in the micrometer and nanometer scale. The methodologies, i.e., technologies, employed to manufacture the memory cells of the present invention have been adopted from integrated circuit (IC) technology. For example, the structures of the present invention are built on wafers and are realized in films of material patterned by photolithographic processes on the top of a wafer. In particular, the fabrication of the memory cells of the present invention uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A memory comprising:
    a plurality of rows and columns, each of which include a memory cell having a pull-down device; and
    at least one boost circuit connected to each of the memory cells and which provides a negative boost signal to the pull-down devices during read access.

2. The memory of claim 1, wherein the at least one boost circuit is a charge pump.

3. The memory of claim 1, wherein the at least one boost circuit is commonly connected to each of the memory cells.

4. The memory of claim 1, wherein the at least one boost circuit is two or more boost circuits.

5. The memory of claim 4, wherein each of the memory cells in each column is commonly connected to a single boost circuit.

6. The memory of claim 1, wherein the at least one boost circuit strengthens the pull-down device of each memory cell during the read access.

7. The memory of claim 6, wherein the at least one boost circuit brings the pull-down device to a higher Vgs during the read access thereby boosting a bitcell low voltage reference (VBOOST1) during the read access.

8. The memory of claim 7, wherein the at least one boost circuit increases a pull-down on the bitcell low voltage reference, BTL0.

9. The memory of claim 7, wherein a circuit switches on and off boost capacitance of the boost circuit during the read access and write operations, respectively.

10. The memory of claim 9, wherein the at least one boost circuit includes a negatively charged capacitor and a transistor which turns off during the read access such that the pull-down device of the memory cell is provided with a negative charge of the negatively charged capacitor.

11. The memory of claim 10, wherein the transistor is turned on during write operations, connecting the pull-down device is connected to GND.

12. A memory, comprising:
    a memory cell comprising a crossover inverter comprising a pull-up device and a pull-down device connected to bitlines through access transistors; and
    a boost circuit connected to the pull-down devices and providing a negative boost signal to the pull-down device during read access.

13. The memory of claim 12, wherein the boost circuit is a charge pump.

14. The memory of claim 13, wherein the charge pump comprises a negatively charged capacitor and a transistor connecting to ground and the pull-down device.

15. The memory of claim 14, wherein when the transistor is on it connects the pull-down device to ground during write operations.

16. The memory of claim 15, wherein when the transistor is off it connects the pull-down device to a negative charge during the read access.

17. The memory of claim 12, wherein the boost circuit strengthens the pull-down device by increasing Vgs during the read access and boosting a bitcell low voltage reference (BTL0).

18. The memory of claim 12, wherein the boost circuit switches on and off boost capacitance during the read access and write operations, respectively.

19. The memory of claim 12, wherein the pull-down devices are a pair of NFETs, and the boost control is connected to the source of the NFETs.

20. A method comprising boosting negatively a bitcell of a memory device during a read access.

* * * * *